United States Patent [19]

Pearson

[11] Patent Number: 4,952,881
[45] Date of Patent: Aug. 28, 1990

[54] ELECTRICAL TEST DEVICE

[75] Inventor: John Pearson, Matlock, United Kingdom

[73] Assignee: Hanning Limited, Uttoxeter, United Kingdom

[21] Appl. No.: 325,401

[22] Filed: Mar. 17, 1989

[30] Foreign Application Priority Data

Mar. 24, 1988 [GB] United Kingdom ............. 8807021

[51] Int. Cl.$^5$ ............................................. G08B 29/00
[52] U.S. Cl. .................................... 324/557; 340/532; 340/523
[58] Field of Search .................. 324/557, 558, 559, 72; 340/523, 532

[56] References Cited

U.S. PATENT DOCUMENTS

| | | | |
|---|---|---|---|
| 2,882,494 | 4/1959 | Webster | 340/532 |
| 2,931,018 | 3/1960 | Tellefsen | 340/532 |
| 3,860,904 | 1/1975 | Andersen | 340/523 |
| 4,422,067 | 12/1983 | Clark | 340/532 |

FOREIGN PATENT DOCUMENTS 1387828 3/1975 United Kingdom .............. 340/532

Primary Examiner—Reinhard J. Eisenzopf
Assistant Examiner—Jose M. Solis
Attorney, Agent, or Firm—Jones, Day, Reavis & Pogue

[57] ABSTRACT

An electrical insulation testing device has a voltage source 12 for applying a test voltage through terminals 14. Measuring devices 16 take measurements to enable the resistance of the insulation under test to be determined. Results are shown by a display 20. The controller 24 prevents the display of results until the voltage source 12 has been turned off and discharge circuit 22 has discharged the capacitance of the insulation under test. This prevents the insulation being left charged after the test. Measurement is commenced by operation of the switch 28. Only one measurement can be taken each time the switch 28 is closed.

14 Claims, 2 Drawing Sheets

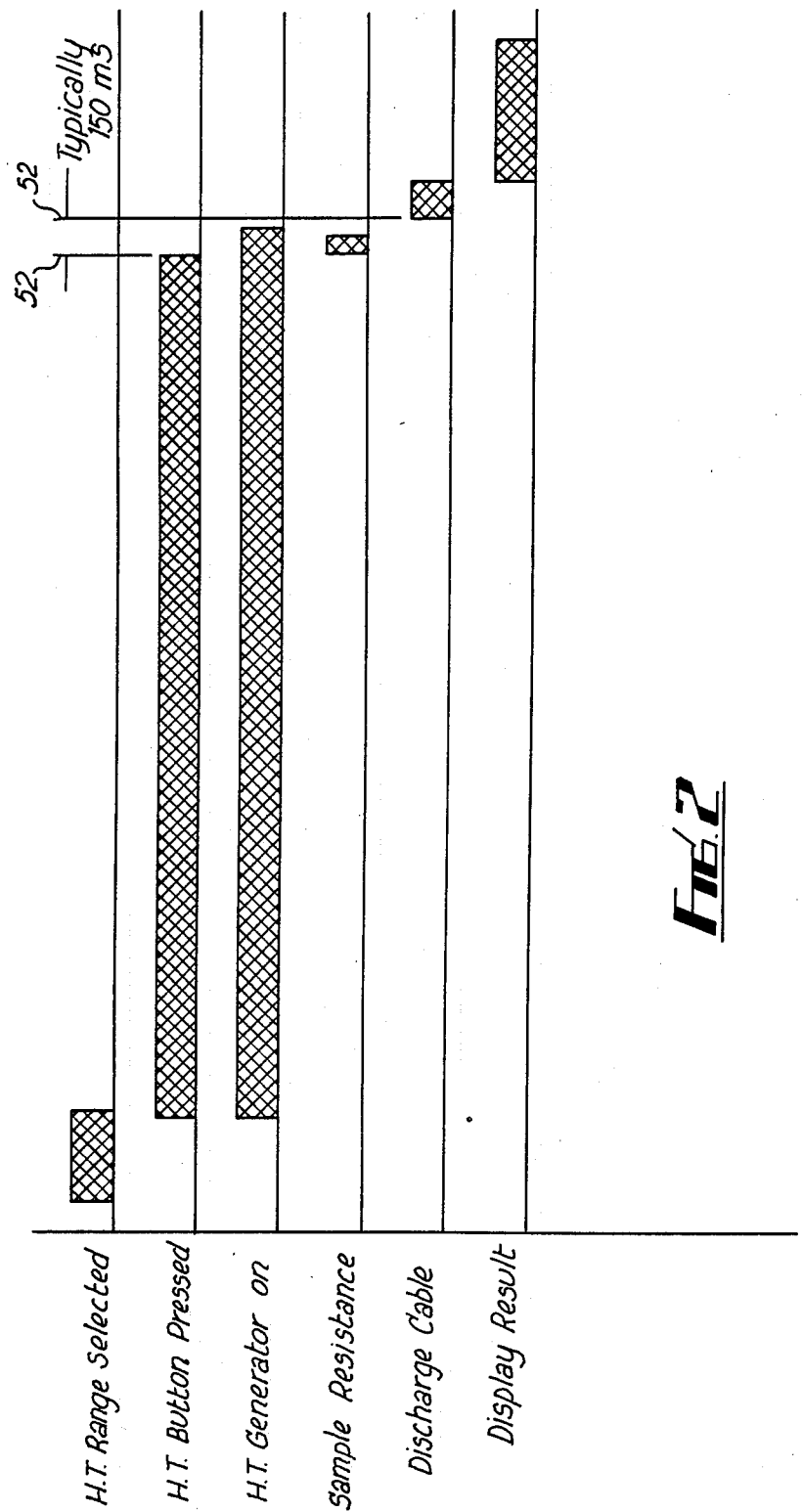

ELECTRICAL TEST DEVICE

FIELD OF THE INVENTION

The present invention relates to electrical test devices and in particular, to test devices for testing insulation.

BACKGROUND OF THE INVENTION

It is regularly necessary to test the insulation properties of components used in hazardous environments such as underground in mines. For instance, the insulation properties of trailing cables which provide power to moving mnachinery must be checked, to ensure that they have not been damaged.

A device has been used for many years for testing insulation in mines. The device contains a voltage generator which generates 500 volts at two terminals which are connected by flying leads to the insulation to be tested. A push button is pressed by the operator to cause the voltage to be generated and a needle meter gives a reading which falls slowly until a pre-determined reading is reached or passed, if the insulation is adequate. If the needle fails to fall, or fails to fall sufficiently, a fault in the insulation is indicated. When the push button is released, the capacitance of the insulation being tested is automatically discharged.

In order to speed up the testing procedure when several items are to be tested, it is common to use this device in an extremely dangerous manner, which does not comply with the requirements of intrinsic safety. (Intrinsic safety is a set of techniques and design criteria which aim to minimize or eliminate the dangers of high voltages in hazardous enviroments.) The push button is held or jammed in its operative position to cause a test voltage to be permanently generated. The flying leads are then connected to each insulation in turn and left in place until a satisfactory reading has been obtained, before being moved to the next insulation. This gives rise to two sources of danger. Firstly, high voltage flying leads are being moved around giving the risks of electric shock, although the voltage source will normally be "intrinsically safe". Secondly, the components which have been tested are not discharged after testing and are therefore left charged to 500 volts. Their large capacitance and the high voltage mean that the charged components are not intrinsically safe, and indeed are extremely dangerous.

It is an object of the present invention to obviate or mitigate these disadvantages of the prior art.

SUMMARY OF THE INVENTION

The invention provides an electrical test device for testing insulation, comprising a voltage source operable to apply a test voltage to insulation to be tested, measuring means operable during operation of the voltage source to measure parameters which enable the resistance of the insulation to be determined, discharge means operable to discharge a capacitance formed by the insulation, the discharge means being operable after the voltage source has ceased to apply the test voltage, and display means for indicating the resistance determined from the parameters, the display means being operable to indicate the resistance only after the discharge means has substantially wholly discharged the capacitance.

Preferably the voltage source operates in response to the operation of a first manual control, and continues to apply the test voltage during an extension period after the manual control is released, the measuring means being operable during the extension period. The measuring means is preferably operable only during the extension period. The measuring means preferably operates only once in response to each operation of the first manual control. The extension period may be sufficiently short as to substantially prevent the voltage source being disconnected, during the extension period, from the insulation to be tested. The duration of the extension period may be about 150 ms.

The device preferably comprises a second manual control operable to commence timing of a control period during which the voltage source may be manually caused to begin applying the test voltage, the voltage source being prevented from so beginning except during the control period. The duration of the control period may be about 10 second.

The device may further comprise means for measuring voltages and/or current at test terminals for display on the display means. The test terminals may be provided in addition to terminals through which the test voltage is applied to insulation.

The test voltage is preferably the working voltage of the insulation being tested. The test voltage may be in excess of 1 kV. The test voltage may be 1.1 kV.

The device may comprise control means operable to enable and disable the voltage source, measuring means, discharge means and display means in accordance with a predetermined sequence.

BRIEF DESCRIPTION OF THE DRAWINGS

One embodiment of a device according to the present invention will now be described in more detail, by way of example only and with reference to the accompanying drawings in which:

FIG. 2 is a timing diagram illustrating the operation of the device.

DESCRIPTION OF THE PREFERRED EMBODIMENT

Figure 1:
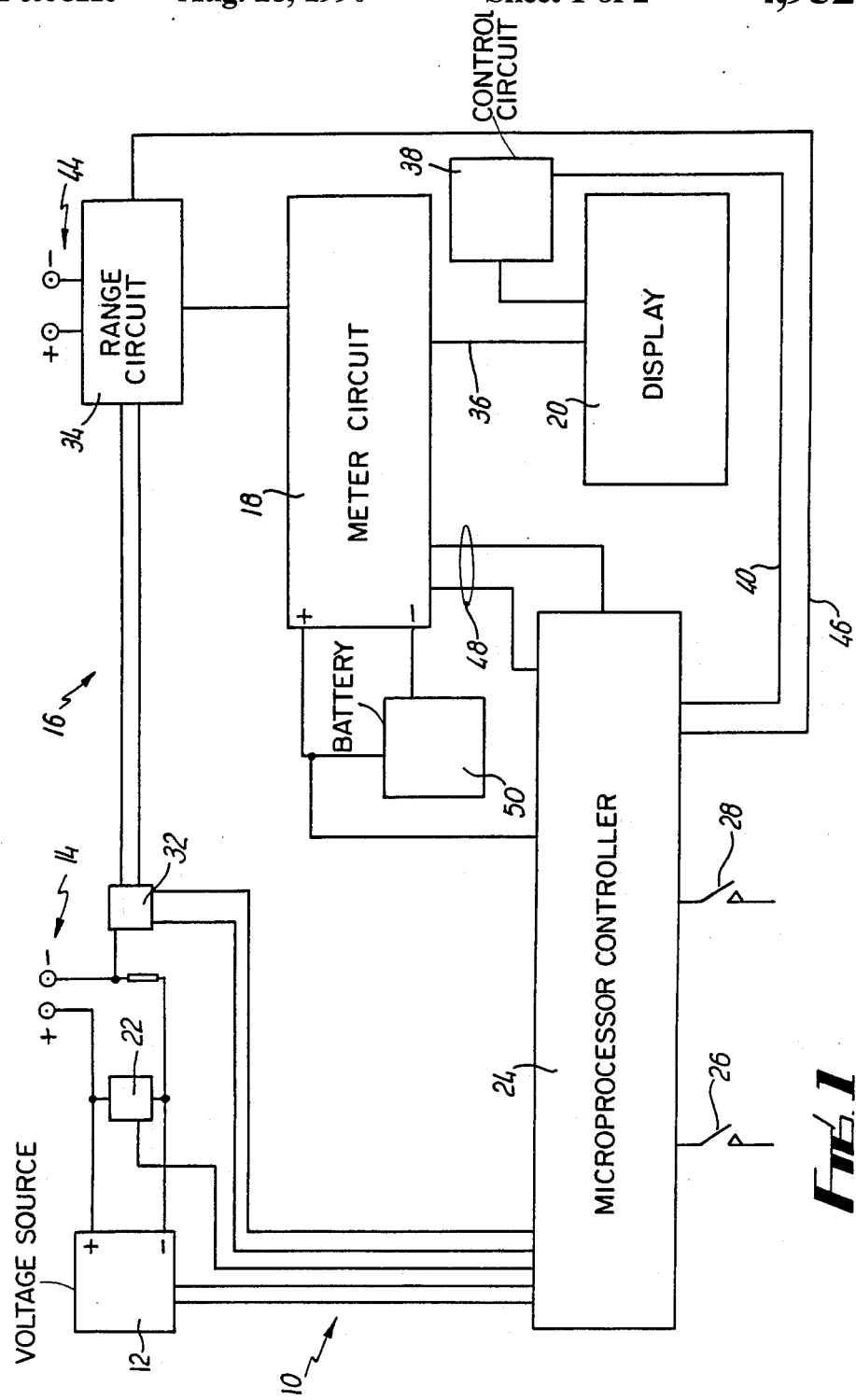
FIG. 1 is a block diagram of the circuitry of the device.

The electrical test device 10 is for testing insulation. The device 10 comprises a voltage source 12 operable to apply a test voltage to insulation to be tested. The voltage is applied through insulation test terminals 14. Measuring means 16 include a meter circuit 18 and ancilliary devices including a display 20 and sampling circuitry 32. The measuring means 16 is operable during operation of the voltage source 12 to measure parameters which enable the resistance of the insulation being tested to be determined. Discharge means 22 are operable to discharge a capacitance formed by the insulation after the voltage source 12 has ceased to apply the test voltage. The display 20 is used to indicate the resistance determined from the parameters. The display means is operable to indicate the resistance only after the discharge means 22 has substantially wholly discharged the capacitance of the insulation being tested.

The various components of the device 10 are under the control of a microprocessor controller 24. The controller 24 is connected to two manual control switches 26, 28. A first switch 26 is a range switch used to control the function of the device 10 and the meter circuit 18 as will be described. The second switch 28 is the insulation test switch which controls the insulation testing as will be described.

The controller 24 is connected to the voltage source 12, which is an HT generator, to instruct the source 12 to generate the high voltage used as the test voltage. The test voltage is applied to the insulation test terminals 14. The source 12 constantly reports to the controller 24 the output voltage being supplied to the terminals 14. The discharge circuit 22 is connected in parallel with the voltage source 12 and the insulation test terminals 14 and is controlled by the controller 24 to short the terminals 14 together when required.

Sampling circuitry 32 is connected to the test terminals 14 and controlled by the controller 24 to take readings which enable the resistance of the insulation being tested to be calculated. These readings are passed back through range circuitry 34 to the meter circuit 18, when required. The meter circuit 18 controls the display 20 over a connection 36 so that an indication of the results of the test can be displayed.

An annunciator control circuit 38 is instructed by the controller 24 over the connection 40 and in turn controls the display 20 to show the units of measurement and the function being performed.

The range circuitry 34 is additionally connected to two measurement terminals 44 for use in other test functions. The controller uses connections 46 and 48 to instruct the operation of the meter circuit and of the range circuitry 34 according to the test or measurement which is to be made.

A power supply 50 such as a battery provides operating power for the components of the device, but the completer set of connections from the power source 50 are not shown in FIG. 2, in the interests of clarity.

The operation of the device when used for testing insulation will now be described with reference to FIG. 2 which is a timing diagram having a horizontal time axis. Each hoizontal line represents a different function of the device or part of the device and the cross-hatched horizontal bars represent the period during which that function takes place.

Testing begins by manual operation of the range switch 26. This is operated to instruct the controller 24 that an insulation test is required. The device operates additionally as a multi-meter as will be described, and it may therefore be necessary to operate the rangee switch 26 several times in order to select the insulation testing function from among other options. The annunciator control 38 indicates the option currently selected by display an appropriate symbol on the display 20. As soon as the insulation testing function is selected, the controller 24 begins to time a control period. If the insulation test switch 28 has not been operated before the end of this control period, (which may be about ten seconds in duration) the insulation test function will be treated as having no longer been selected and the device will turn off. The control period is indicated as the top horizontal bar in FIG. 2.

However, if the insulation test switch 28 is operated before the end of the control period (as shown by the second horizontal bar in FIG. 2) a sequence of events for testing the insulation is initiated. The controller 24 turns on the voltage source 12 to generate a test voltage at the terminals 14 for a period indicated by the third bar in FIG. 2. The test voltage is preferably the working voltage of the component being tested. For mining use, this may be at least one kV, and may be 1.1 kV. The use of the working voltage allows a more severe and accurate test of the insulation to be carried out than has hitherto been possible. The risk of insulation being tested with satisfactory results and then breaking down at a higher working voltage is thereby eliminated.

The source 12 incorporates a series resistor to drop the output voltage when current is drawn, and thereby render the source intrinisically safe. Initially, the voltage applied by the terminals 14 will be low, and will rise to its full value as the capacitance of the insulation is charged. The symbol representing insulation testing is causing to flash on the display 20 until the source 12 informs the controller that full voltage has been reached, and the capacitance is charged. The symbol then ceases to flash and the switch 28 is released by the operator. This time represents the start of an extension period represented between two vertical lines 52 in FIG. 2. Generation of the test voltage does not stop when the switch 28 is released, but continues through all or part of the extension period which may be about 150 ms. During the extension period, the sampling circuitry 32 (represented by the fourth bar) is used to take voltage and current readings toe enable the resistance of the insulation to be calculated. These readings are sent back to the meter circuit 18 which performs the necessary calculations. At this stage, the display 20 is not showing the calculated result. At the end of the extension period, the controller 24 operates the cable discharge circuitry 22 (the fifth bar in FIG. 2) to short the terminals 14 together and discharge the insulation. Alternatively, a controlled discharge may be used instead of shorting. Once the controller 24 has operated the discharge circuitry 22, it instructs the meter circuit to display the results of the insulation test (the sixth bar in FIG. 2). This may be displayed by giving a resistance reading in appropriate units or by providing a simpler display showing whether the insulation is adequate or not. The result will be displayed for a display period chosen to be conveniently long, but may be interupted by further operation of the range switch 26 to instruct other functions to begin, or by further operation of the insulation test switch 28. This allows several readings to be taken from the same insulation without disconnecting the terminals 14.

The other functions available may include standard multimeter functions such as voltage readings and current readings taken by the range circuitry 34 through the measurement terminals 44 and processed by the meter circuit 18 for display on the display 20.

It will be apparent from the above description that the result of the insulation test is not available to the user until the discharge circuitry 22 has operated to make the insulation safe. Only then can the user discover the result of the test. Only one reading is provided each time the insulation test switch 28 is operated and the device cannot therefore be misused by holding down the switch 28 while moving the terminals 14 between different devices. There is therefore no incentive to disconnect the terminals during the extension period, while they remain live at the test voltage. Moreover, the extension period is sufficiently short that this may not be possible or, if possible, will not represent an unacceptable danger.

Variations and modifications to the apparatus described may be made without departing from the spirit and scope of the present invention. In particular other components and other arrangements of components could be used to provide a device which operates in substantially the same manner as that described. The timing diagram by which the device operates could be changed, in particular to change the lengths of the initial control period and the extension period.

The device described above is primarily intended for use as a hand-held test device which may be used to test a variety of different items. However, a device according to the invention could be permanently incorporated into a piece of apparatus whose insulation requires periodic testing and may even be arranged to operate automatically at regular intervals. Provision may be made for the test device to disable an appropriate piece of equipment if an insulation test reveals inadequate insulation, and an alarm may also be sounded. It is envisaged that a device according to the invention may be incorporated in a junction box from which cables extend to various pieces of machinery, and could be used to test the insulation of each cable automatically, in sequence and then to disconnect any cable found to be faulty.

I claim:

1. An electrical insulation testing device comprising a voltage source, connection means, measuring means, discharge means, display means, and control means operable to control the operation of said voltage source, said measuring means, said discharge means and said display means, said connection means being operable to electrically connect said voltage source to insulation to be tested, said voltage source being controlled by said control means to apply a test voltage to insulation to which said voltage source is connected by said connection means, said measuring means being controlled by said control means to measure parameters which enable the resistance of said insulation to be determined, and control means causing said discharge means to discharge the capacitance of said insulation after said measuring means has operated, said display means being operable to indicate the resistance determined from said measured parameters, and said control means preventing said display means indicating said determined resistance until said discharge means has substantially wholly discharged said capacitance.

2. The device of claim 1, further comprising a first manual control and in which said voltage source is controlled by the operation of said first manual control, and said voltage source continues to apply said test voltage during an extension period after said first manual control is released, said measuring means being operable during said extension period.

3. The device of claim 2, wherein said measuring means is operable only during said extension period.

4. The device of claim 2, wherein said measuring means is operable only once in response to each operation of said first manual control.

5. The device of claim 2, wherein said extension period is sufficiently short as to substantially prevent the voltage source being manually disconnected, during said extension period, from said insulation to be tested.

6. The device of claim 5, wherein said extension period is about 150 ms.

7. The device of claim 1 further comprising a second manual control, said control means being operable in response to actuation of said second manual control to commence timing of a control period, said voltage source being operable to begin applying said test voltage only during said control period.

8. The device of claim 7, wherein said control period is about 10 seconds.

9. The device of claim 1, further comprising second connection means, and means operable to measure voltages and/or current at said second connection means, said display means being operable to display results of said measurements.

10. The device of claim 1, wherein said voltage source is operable to generate a test voltage which is the working voltage of the insulation being tested.

11. The device of claim 10, wherein said test voltage is in excess of 1 kV.

12. The device of claim 11, wherein said test voltage is 1.1 kV.

13. Apparatus for testing insulating properties of electrical insulation, said apparatus including voltage applying means for applying a voltage to electrical insulation and imparting a capacitive charge thereto, maasuring means for measuring parameters indicative of the electrical resistance of the electrical insulation, display means for displaying a reading representative of the resistance of the electrical insulation, discharge means for discharging the capacitive charge on the electrical insulation, and control means for preventing operation of said display means until after said discharge means has operated to discharge the capacitive charge.

14. Apparatus for testing insulating properties of electrical insulation, said apparatus including a pair of spaced terminals engageable with insulation, voltage applying means for applying a voltage across said terminals and imparting a capacitive charge to electrical insulation engaged by said terminals, measuring means for measuring parameters indicative of the electrical insulating properties of electrical insulation engaged by said terminals, display means for displaying a reading representative of the electrical insulating properties of the electrical insulation being tested, discharge means for shorting said terminals to discharge a capacitive charge on the electrical insulation, control means for operating said discharge means and said display means and for operating said discharge means prior to operation of said display means and for preventing operation of said display means until after operation of said discharge means.

* * * * *